US012787365B2

(12) United States Patent
Li et al.

(10) Patent No.: US 12,787,365 B2
(45) Date of Patent: Nov. 3, 2026

(54) GATE-ALL-AROUND (GAA) NANOSHEET DEVICE HAVING INNER GATE SPACER WITH ROUNDED EDGES

(71) Applicant: QUALCOMM Incorporated, San Diego, CA (US)

(72) Inventors: Xia Li, San Diego, CA (US); Junjing Bao, San Diego, CA (US); Biswa Ranjan Panda, Bangaluru (IN)

(73) Assignee: QUALCOMM Incorproated, San Diego, CA (US)

(*) Notice: Subject to any disclaimer, the term of this patent is extended or adjusted under 35 U.S.C. 154(b) by 437 days.

(21) Appl. No.: 18/475,053

(22) Filed: Sep. 26, 2023

(65) Prior Publication Data

US 2025/0107157 A1 Mar. 27, 2025

(51) Int. Cl.

| | |
|---|---|
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |

(52) U.S. Cl.

CPC ....... *H10D 30/6757* (2025.01); *H10D 30/014* (2025.01); *H10D 30/43* (2025.01); *H10D 30/6735* (2025.01); *H10D 62/121* (2025.01); *H10D 64/018* (2025.01)

(58) Field of Classification Search

None

See application file for complete search history.

(56) References Cited

U.S. PATENT DOCUMENTS

| | | | | |
|---|---|---|---|---|
| 2020/0066839 | A1* | 2/2020 | Zhang | H10D 30/014 |
| 2021/0242328 | A1 | 8/2021 | Cheng et al. | |
| 2022/0037506 | A1 | 2/2022 | Chen et al. | |
| 2022/0149176 | A1* | 5/2022 | More | H10D 30/6713 |
| 2023/0137528 | A1* | 5/2023 | Wu | H10B 10/12<br>257/288 |

OTHER PUBLICATIONS

International Search Report and Written Opinion—PCT/US2024/046652—ISA/EPO—Dec. 4, 2024.

* cited by examiner

*Primary Examiner* — Xiaoming Liu

(74) *Attorney, Agent, or Firm* — Muncy. Geissler, Olds & Lowe, P.C.

(57) ABSTRACT

An electronic device having one or more Gate-All-Around GAA transistors is disclosed. At least one of the one or more GAA transistors comprises one or more inner gate structures having a work function metal bounded by a gate dielectric; and one or more inner gate spacers associated with the one or more inner gate structures, wherein each of the one or more inner gate structures has a generally convex outer edge that conforms to a generally concave inner edge of an associated inner gate spacer of the one or more inner gate spacers.

27 Claims, 16 Drawing Sheets

GATE-ALL-AROUND (GAA) NANOSHEET DEVICE HAVING INNER GATE SPACER WITH ROUNDED EDGES

FIELD OF DISCLOSURE

The present disclosure generally relates to gate-all-around (GAA) transistors, and more particularly, to inner gate spacers and inner gate structures for GAA transistors and methods of making the inner gate spacers and inner gate structures.

BACKGROUND

Integrated circuit (IC) technology has achieved great strides in advancing computing power through miniaturization of electrical components. An IC may be implemented in the form of an IC chip that has a set of circuits integrated thereon. In some implementations, one or more IC chips can be physically carried and protected by an IC package, where various power and signal nodes of the one or more IC chips can be electrically coupled to respective conductive terminals of the IC package via electrical paths formed in a package substrate of the IC package. Various packaging technologies can be found in many electronic devices, including processors, servers, radio frequency (RF) integrated circuits, etc. Advanced packaging and processing techniques can be used to implement complex devices, such as multi-electronic component devices and system on a chip (SOC) devices, which may include multiple function blocks, with each function block designed to perform a specific function, such as, for example, a microprocessor function, a graphics processing unit (GPU) function, a communications function (e.g., WiFi, Bluetooth, and other communications), and the like.

Transistors are considered the fundamental building blocks of electronic devices and are frequently incorporated into IC chips. Such transistors have undergone several evolutionary changes to meet the ever-increasing demand for high performance, low power consumption, and miniaturization. As the dimensions of these transistors are scaled down to meet the demands for higher transistor densities, challenges such as short-channel effects, leakage currents, and power dissipation have become increasingly problematic.

Non-planar transistors, such Gate-All-Around (GAA) transistors, have been developed to address these challenges. In GAA transistors, the gate material completely encircles the conducting channel-often formed from nanowires or nanosheets-resulting in improved electrostatic control and uniformity of the electric field. The non-planar transistor designs offer advantages such as lower leakage currents, improved threshold voltage control, and the ability to operate at reduced supply voltages, thus enhancing overall energy efficiency.

While such non-planar transistor architectures have improved transistor performance, they also present new challenges and complexities in terms of fabrication, material selection, and electrical characteristics. Accordingly, there is a need for improved non-planar transistor architectures and methods for making them.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an electronic device having one or more Gate-All-Around (GAA) transistors includes one or more inner gate structures having a work function metal bounded by a gate dielectric; and one or more inner gate spacers associated with the one or more inner gate structures, wherein at least one of the one or more inner gate structures has a generally concave outer edge that conforms to a generally convex inner edge of at least one inner gate spacer of the one or more inner gate spacers.

In an aspect, a Gate-All-Around (GAA) transistor includes one or more inner gate structures having a work function metal bounded by a gate dielectric; and one or more inner gate spacers associated with the one or more inner gate structures, wherein at least one of the one or more inner gate structures has a generally convex outer edge that conforms to a generally concave inner edge of at least one inner gate spacer of the one or more inner gate spacers.

In an aspect, a method of forming a gate-all-around (GAA) transistor includes forming a plurality of channel structures each having a semiconductor channel separating a respective source and drain of the GAA transistor; forming a gate structure associated with each of the semiconductor channels of the plurality of channel structures; and forming at least one inner gate spacer associated with a given inner gate structure, wherein the forming of the at least one inner gate spacer comprises forming the at least one inner gate spacer to have a generally concave edge surface conforming to a generally convex outer edge of the gate dielectric of the given inner gate structure.

In an aspect, a method of forming a gate-all-around (GAA) transistor includes forming a multi-layer structure having alternating silicon and silicon-germanium sheets, wherein the silicon-germanium sheets have different germanium concentrations; subjecting the multi-layer structure to an etching process to form etched silicon-germanium sheets, wherein the etching process employs an action to that etches each silicon-germanium sheet at a rate corresponding to the germanium concentration of the silicon-germanium sheet; forming inner gate spacers about the etched silicon-germanium sheets; removing the etched silicon-germanium sheets from the multi-layer structure; and forming gate structures in regions of the multi-layer structure from which the etched silicon-germanium sheets were removed.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1A:
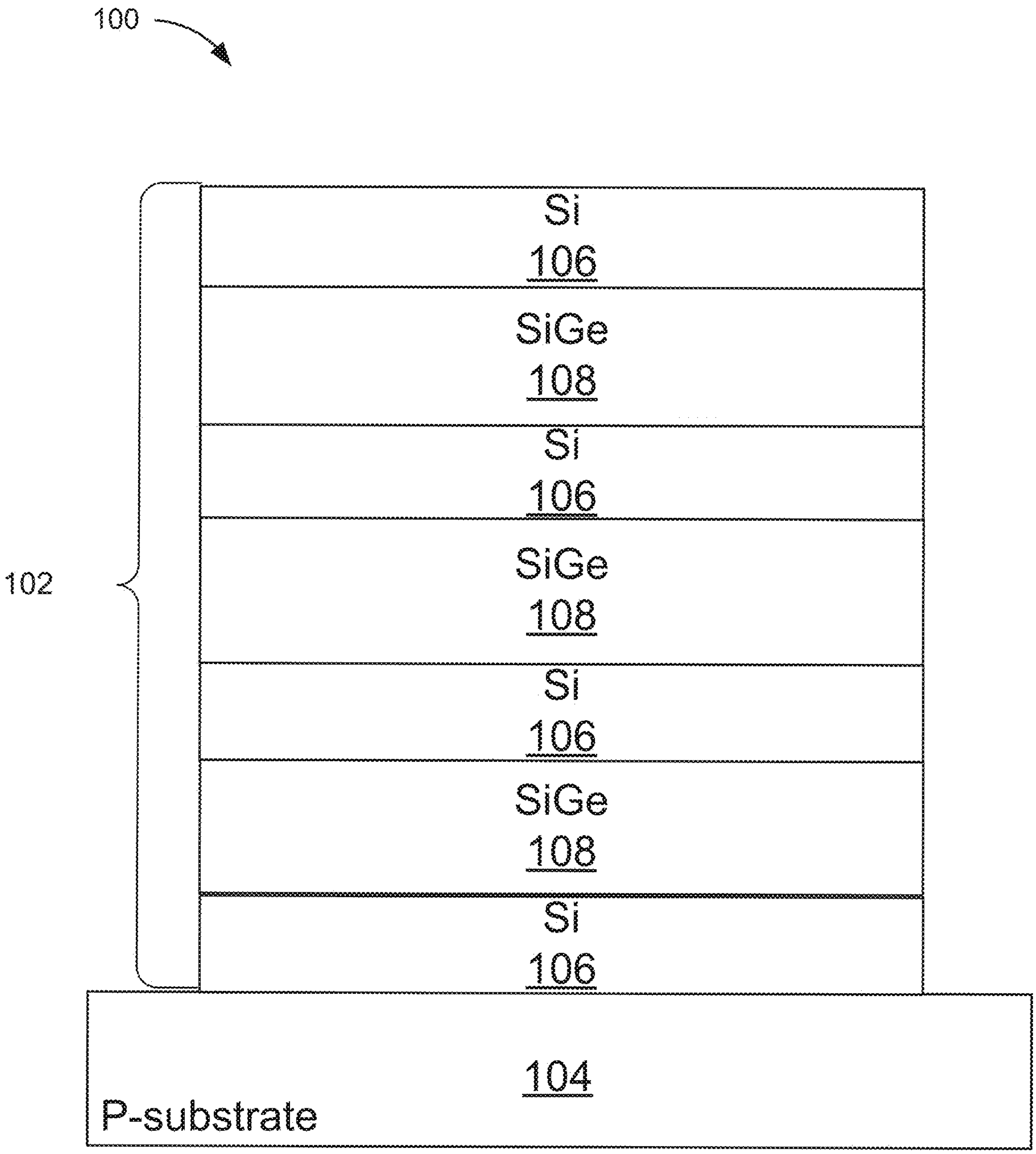
FIG. 1A through FIG. 1D show an example of the processes that may be used to form the inner and outer gate spacers of a Gate-All-Around (GAA) transistor using a conventional fabrication, according to aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises." "comprising." "includes," and/or "including." when used herein, specify the presence of stated features, integers, steps, operations, elements, and/or components, but do not preclude the presence or addition of one or more other features, integers, steps, operations, elements, components, and/or groups thereof. It will also be understood that when a layer is described as "over," "overlying," "under," "underlying," another layer does not necessarily preclude the use of intermediate layers and/or materials that may otherwise be used to ensure adhesion between the layers. Still further, it will be understood that when a layer is described as "over," "overlying," "under," "underlying," another layer that such terms are used with reference to the orientations of such layers as depicted in the reference frame shown in the corresponding figures.

Certain aspects of the disclosure are directed to structures and processes for fabricating Gate-All-Around (GAA) transistors. In accordance with various aspects of the disclosure, GAA transistors include an outer gate structure and a plurality of inner gate structures. The inner gate structures include a work function metal that is bounded by a gate dielectric. The outer and inner gate structures are associated with corresponding doped channels that are connected between the source and drain (S/D) structures. An outer gate spacer is associated with the outer gate structure and each of the inner gate structures are associated with a corresponding inner gate spacer. In an aspect, each of the inner gate structures is bounded by a corresponding inner gate spacer, which provides structural support for the inner gate structures as well as electrical isolation between the inner gate structures and the source/drain structures of the GAA transistor.

As will be understood in view of the teachings of the present disclosure, conventional inner gate spacers often have an inner surface with a convex cross-section adjacent to the gate dielectric of the corresponding gate structure. As such, each inner gate spacer recess has an inner gate spacer corner that is rounded toward the S/D structures. Additionally, the inner gate spacers associated with different inner gate structures do not have uniform widths. As such, when all of the inner gate structures and inner gate spacers are viewed in cross-section, the inner recess profile of the inner gate spacers is rounded, not vertical.

The non-uniformities of the conventional inner gate spacers give rise to challenges in the design of the GAA transistors. Such non-uniformities increase the effective capacitance of the gate structures, contribute to S/D parasitic capacitance, and present the risk that a gate structure will short out to the S/D structures.

Certain aspects of the disclosure are implemented with a recognition that the shape and uniformity of the inner gate spacers is dependent on the shape and uniformity of the sacrificial layers used to form the inner gate spacers during the fabrication of the GAA transistor.

FIG. 1A through FIG. 1D show an example of the processes that may be used to form the inner and outer gate spacers of a GAA transistor using a conventional fabrication, according to aspects of the disclosure. As shown in FIG. 1A, the initial structure 100 from which the GAA transistor is fabricated includes a multi-layer structure 102 comprised of alternating silicon (Si) sheets 106 and silicon-germanium sheets (Si—Ge) 108 disposed over a P-type substrate 104. At least some of the Si sheets 106 will form the doped channels of the GAA transistor, while the SiGe sheets 108 are sacrificial layers that define the regions in which the inner gate structures and inner gate spacers are fabricated.

Figure 1B:
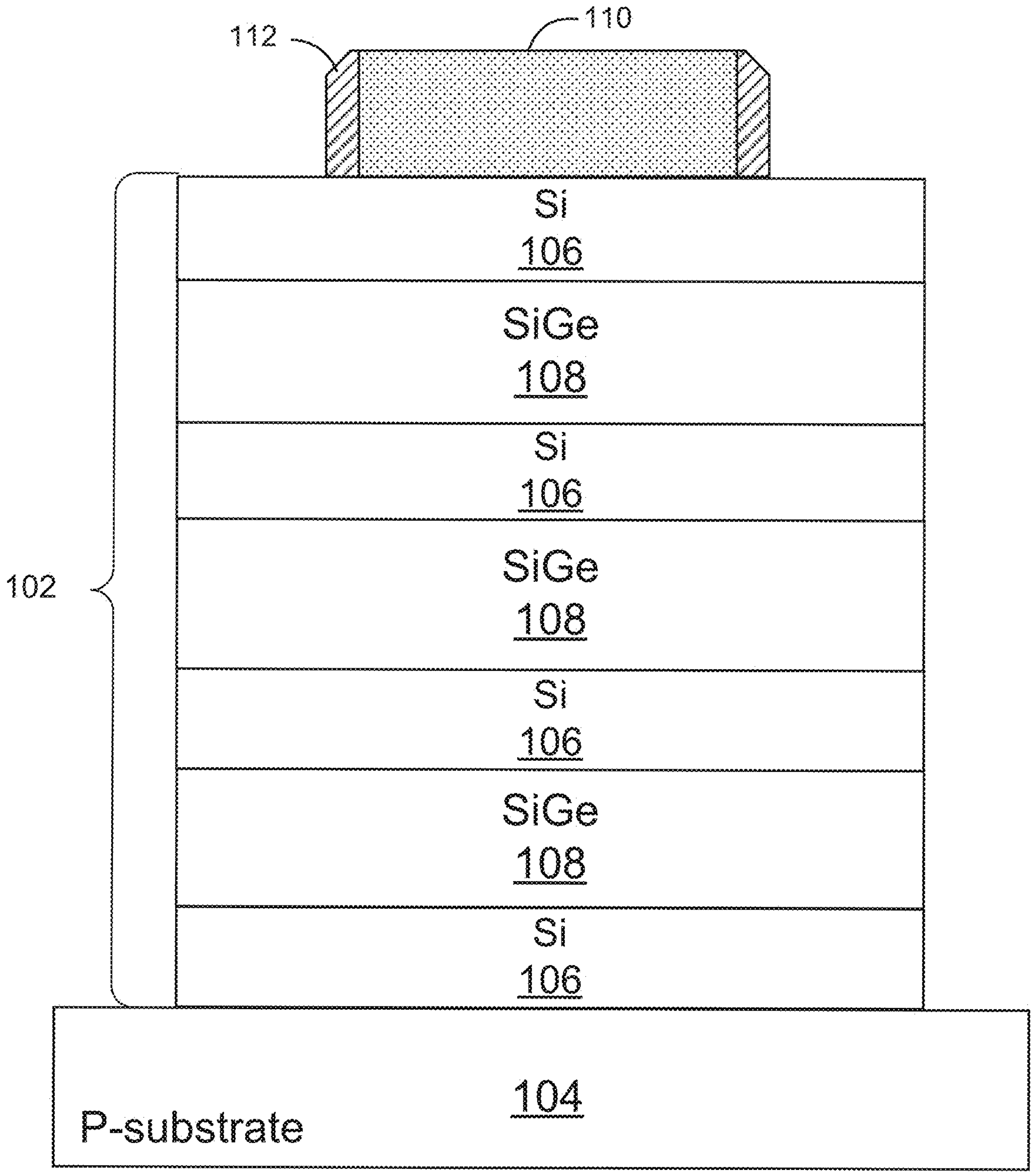

In FIG. 1B, the initial structures used to fabricate the outer gate structure and outer gate spacer are formed over the uppermost Si sheet 106. To this end, a layer of patterned sacrificial polysilicon 110 is formed over the uppermost Si sheet 106 and defines the region in which the upper gate structure will be fabricated. A layer of dielectric material is deposited and patterned about the sides of the sacrificial polysilicon 110 to form the outer gate spacer 112.

Figure 1C:
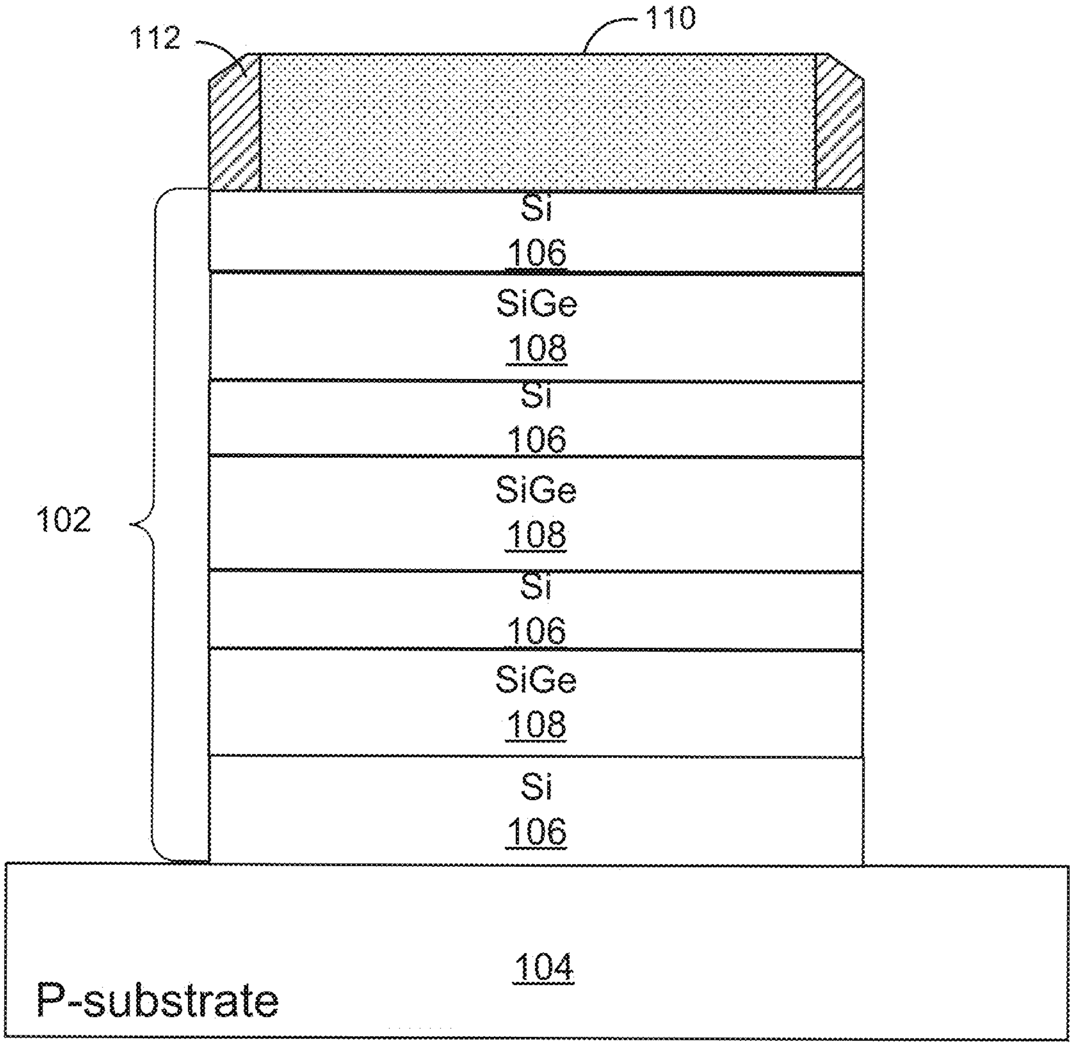
Figure 1D:
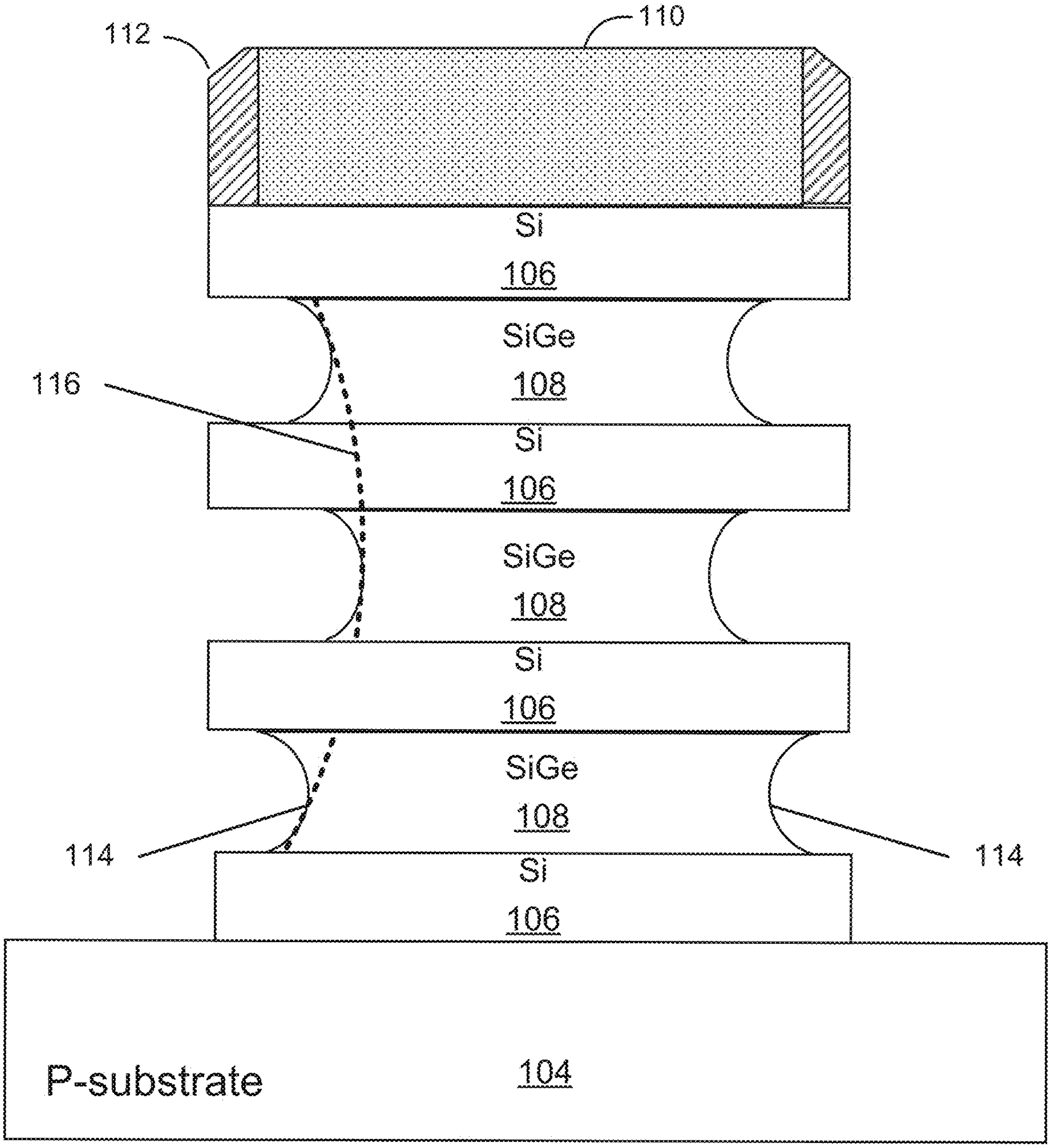

In FIG. 1C, the multi-layer structure 102 is cut to the same width as the width of the outer gate spacer 112 to prepare the layers of the multi-layer structure 102 for etching. In FIG. 1D the multi-layer sheet 102 has been subject to a selective etching process. During the selective etching, the Si sheets 106 remain generally undisturbed while the edges of the SiGe sheets 108 are etched at a rate that corresponds to the concentration of germanium in the SiGe sheet. In accordance with conventional practice, all of the SiGe sheets 108 have the same concentration of germanium and each of SiGe sheet 108 has a uniform intra-sheet distribution of the germanium.

Certain aspects of the disclosure are implemented with a recognition that the selective etching process does not etch the different SiGe sheets 108 in the same manner despite all of them having the same concentration of germanium and same intra-sheet germanium distribution of germanium. Rather, the edges 114 of each of the SiGe sheets 108 have concave cross-sections. Further, the different layers of SiGe sheets 108 have different widths resulting in the curved inter-sheet SiGe recess profile depicted at line 116.

Since the etched SiGe sheets 108 are sacrificial layers that define the regions in which the inner gate structures and inner gate spacers are ultimately formed, the inner spacers will have an inner surface adjacent to the corresponding inner gate spacer that is concave while the outer surface of the inner gate structure will have a convex cross-section. Such non-uniformities increase the effective capacitance of the gate structures since the sharp, concave corners of the gate structure lie a short distance from the S/D structures thereby increasing the capacitance between the gate structure and the S/D structures. Additionally, such non-uniformities contribute to S/D parasitic capacitance and present a high risk that a gate structure will short out to the S/D structures given the short distance between the sharp, concave corners of the gate structure and the S/D structures.

In accordance with certain aspects of the disclosure, the intra-layer shape and inter-layer uniformity are improved by controlling the interlayer and intra-layer germanium concentration of the SiGe sheets. In an aspect, different SiGe sheets may have different germanium concentrations to improve the inter-sheet Si—Ge recess profile. Additionally, or in the alternative, each SiGe sheet may have an inter-layer germanium concentration distribution that may be used to control the shape at the outer SiGe sheet surfaces. In an aspect, the interlayer germanium concentration distribution may be selected so that the inner gate spacers are formed with concave-shaped inner edges and the inner gate structures are formed with convex-shaped outer edges. The resulting shapes of the inner gate spacers and inner gate structures reduce many of the problems arising from conventional inner gate spacer and inner gate structure shapes.

Figure 2A:
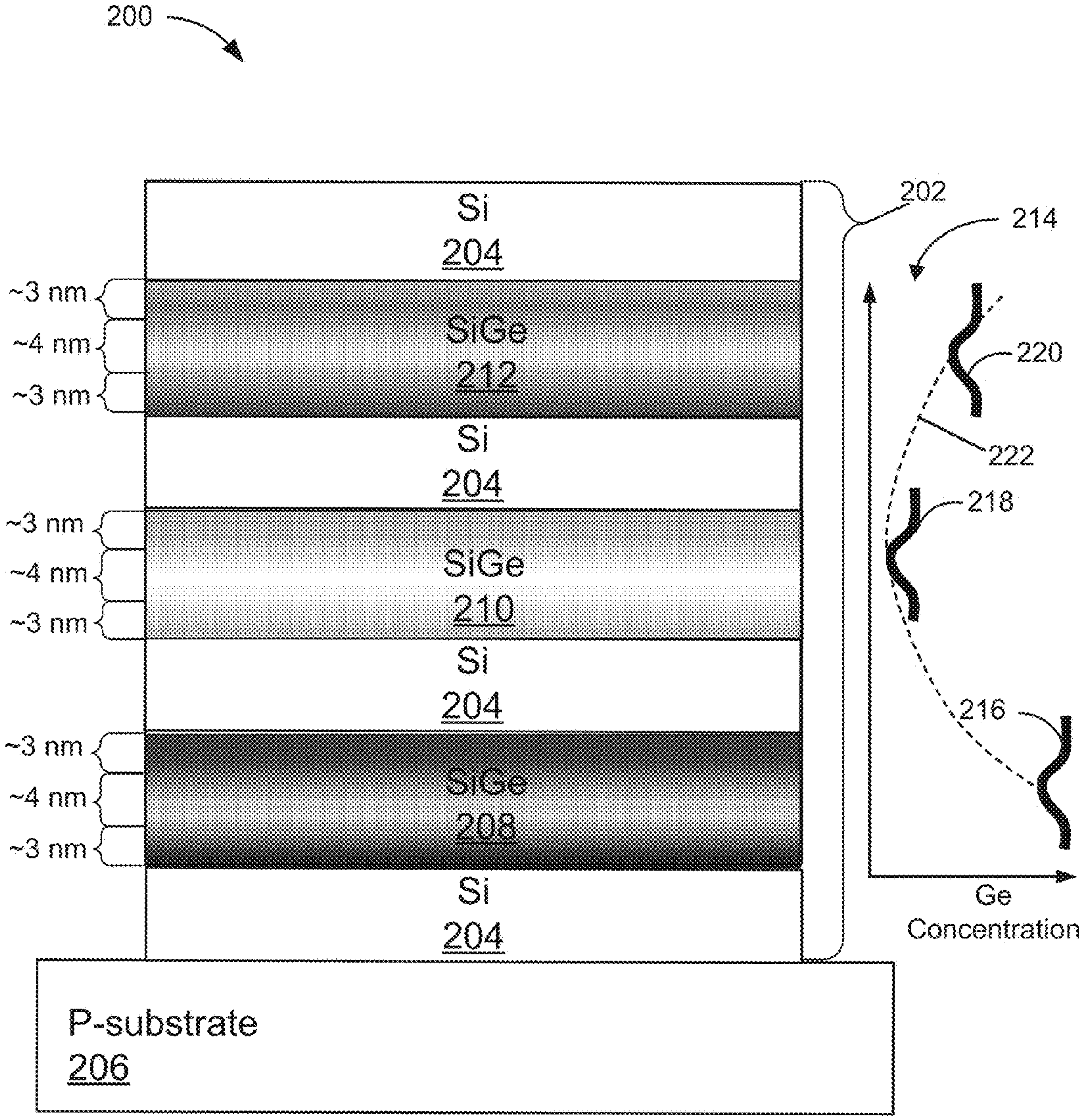
FIG. 2A through FIG. 2G show example method for fabricating a GAA transistor, according to aspects of the disclosure.

FIG. 2A through FIG. 2G show example method for fabricating a GAA transistor, according to aspects of the disclosure. FIG. 2A shows an example of an initial structure 200 that may be used to fabricate the GAA transistor. In this example, the initial structure 200 includes a multi-layer structure 202 comprised of alternating silicon (Si) sheets and sacrificial silicon-germanium sheets (Si—Ge) disposed over a P-type substrate 206. Unlike the multi-layer structure 102 shown in FIG. 1A, the SiGe sheets of the multi-layer structure 202 have different interlayer germanium concentrations as well as different intra-layer germanium concentrations.

In the example shown in FIG. 2A, there are three SiGe sheets 208, 210, and 212. The germanium concentrations and interlayer germanium concentration distributions are depicted in the germanium concentration graph 214, where curve 216 corresponds to the germanium concentration in SiGe sheet 208, curve 218 corresponds to the germanium concentration in SiGe sheet 210, and curve 220 corresponds to the germanium concentration in SiGe sheet 212. As can be seen from the germanium concentration graph 214, SiGe sheet 208 has the highest germanium concentration while SiGe sheet 210 has the lowest germanium concentration. SiGe 212 has a germanium concentration between that of SiGe sheet 208 and SiGe sheet 210. The relative interlayer layer germanium concentration in this example is represented by curve 222. In an aspect, the curve 222 generally corresponds to an inverse of the SiGe sheet recess profile shown at line 116 of FIG. 1D. In an aspect, the curve 222 provides a relative indication of how the interlayer germanium concentration may be adjusted to avoid the undesirable SiGe sheet recess profile, instead providing for a more uniform SiGe sheet recess profile as will be shown in the subsequent example processing operations.

As shown by the curves 216, 218, and 220, each of the SiGe sheets 208, 210, and 212 has an intra-layer germanium concentration distribution that varies along the height of the respective SiGe sheet. In this example, each SiGe sheet 208, 210, and 212 has a germanium concentration distribution in which the germanium concentration along its height is relatively higher at its upper and lower portions (e.g., each having a depth of ~3 nm) when compared to the lower germanium concentration at its mid-section (e.g., having a depth of ~4 nm). In an aspect, shape of each of the curves 216, 218, and 218 generally represents the relative germanium concentrations that may be used to achieve slightly convex-shaped edges with curved corners as will be shown in a subsequent processing operations.

Figure 2B:
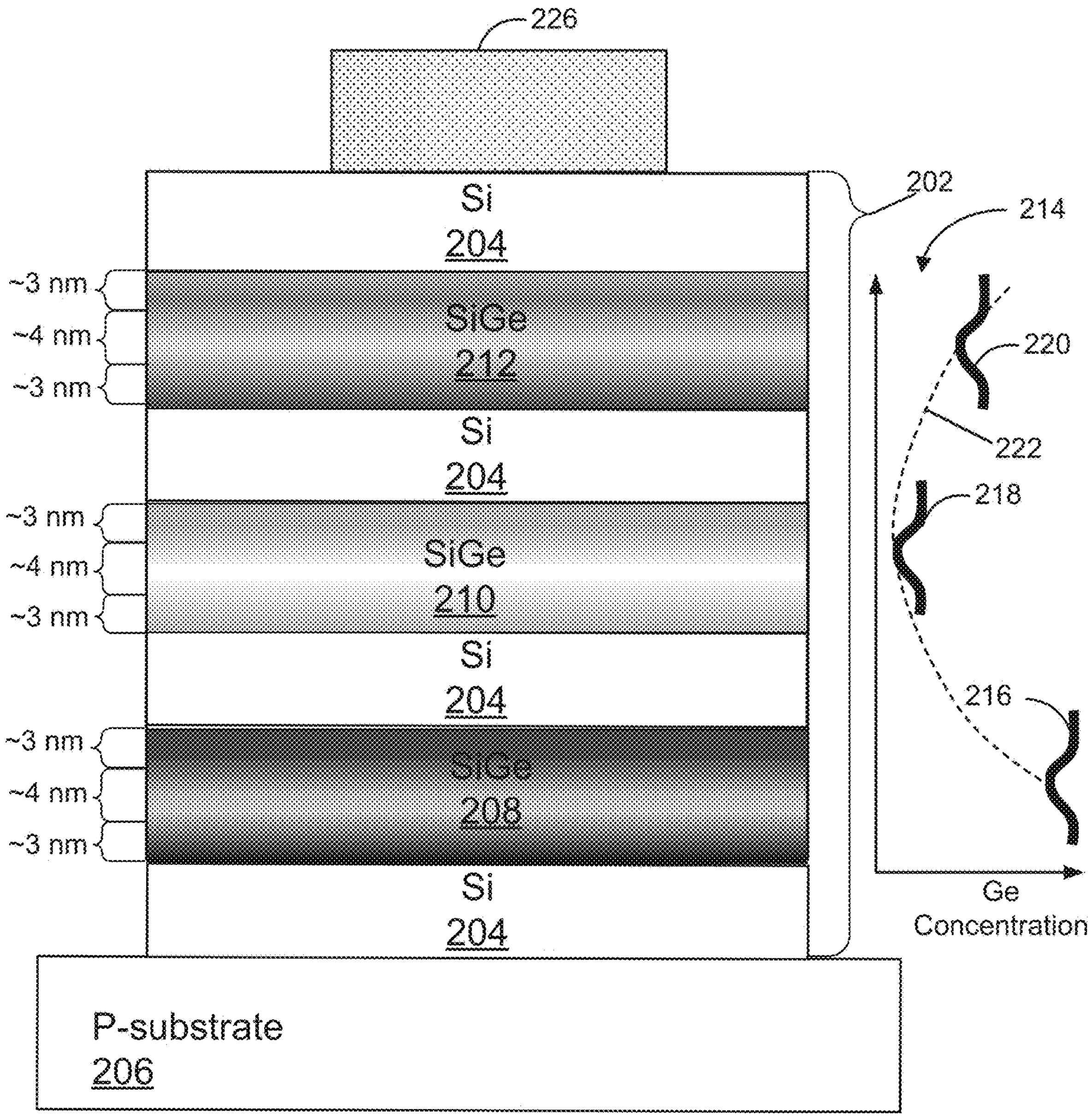

In FIG. 2B, a layer of patterned sacrificial polysilicon 226 is formed over the uppermost Si sheet 204 and defines the region in which the upper gate structure will be fabricated.

Figure 2C:
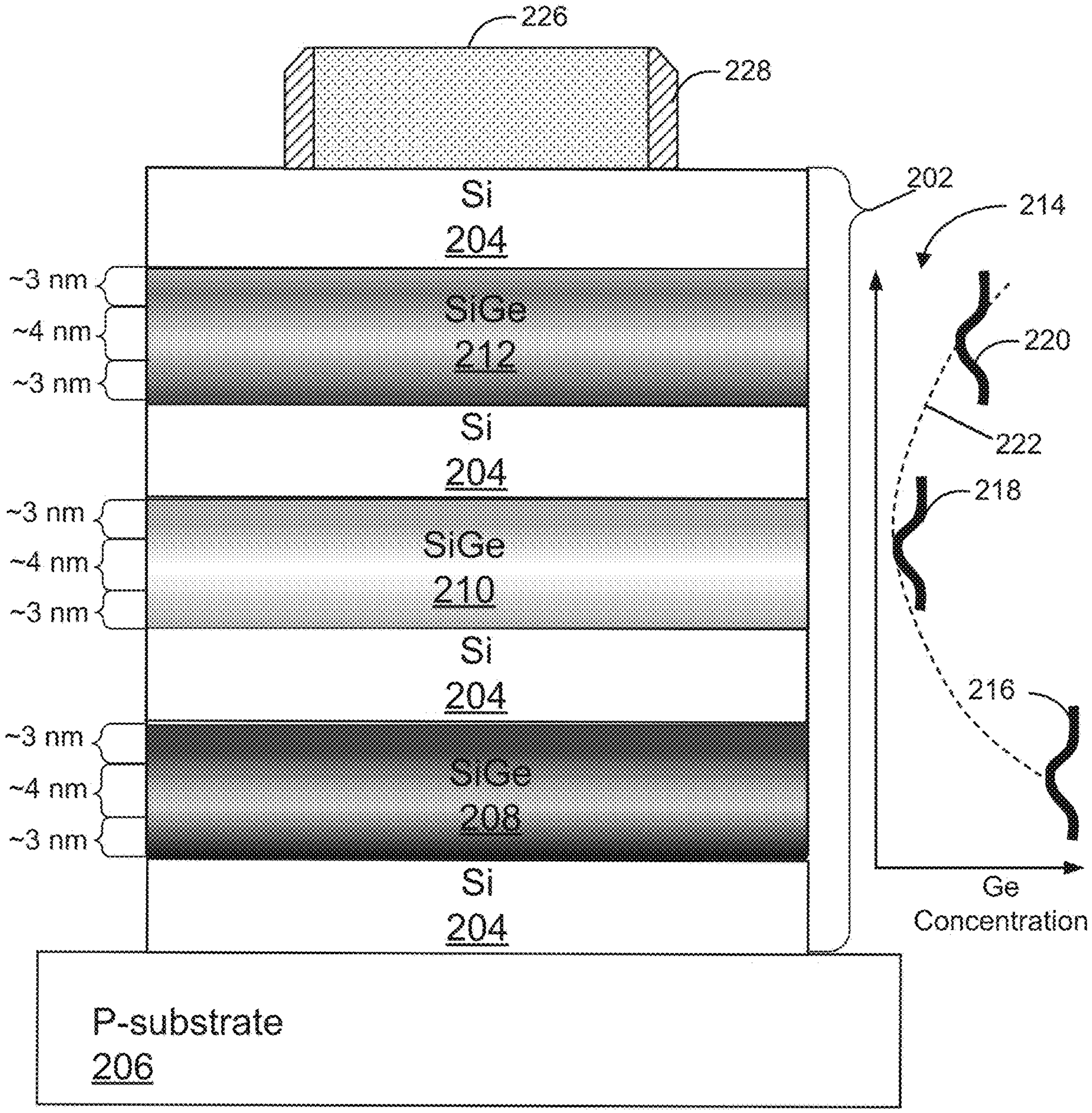

In FIG. 2C, a layer of dielectric material is deposited and patterned about the sides of the sacrificial polysilicon 226 to form the outer gate spacer 228.

Figure 2D:
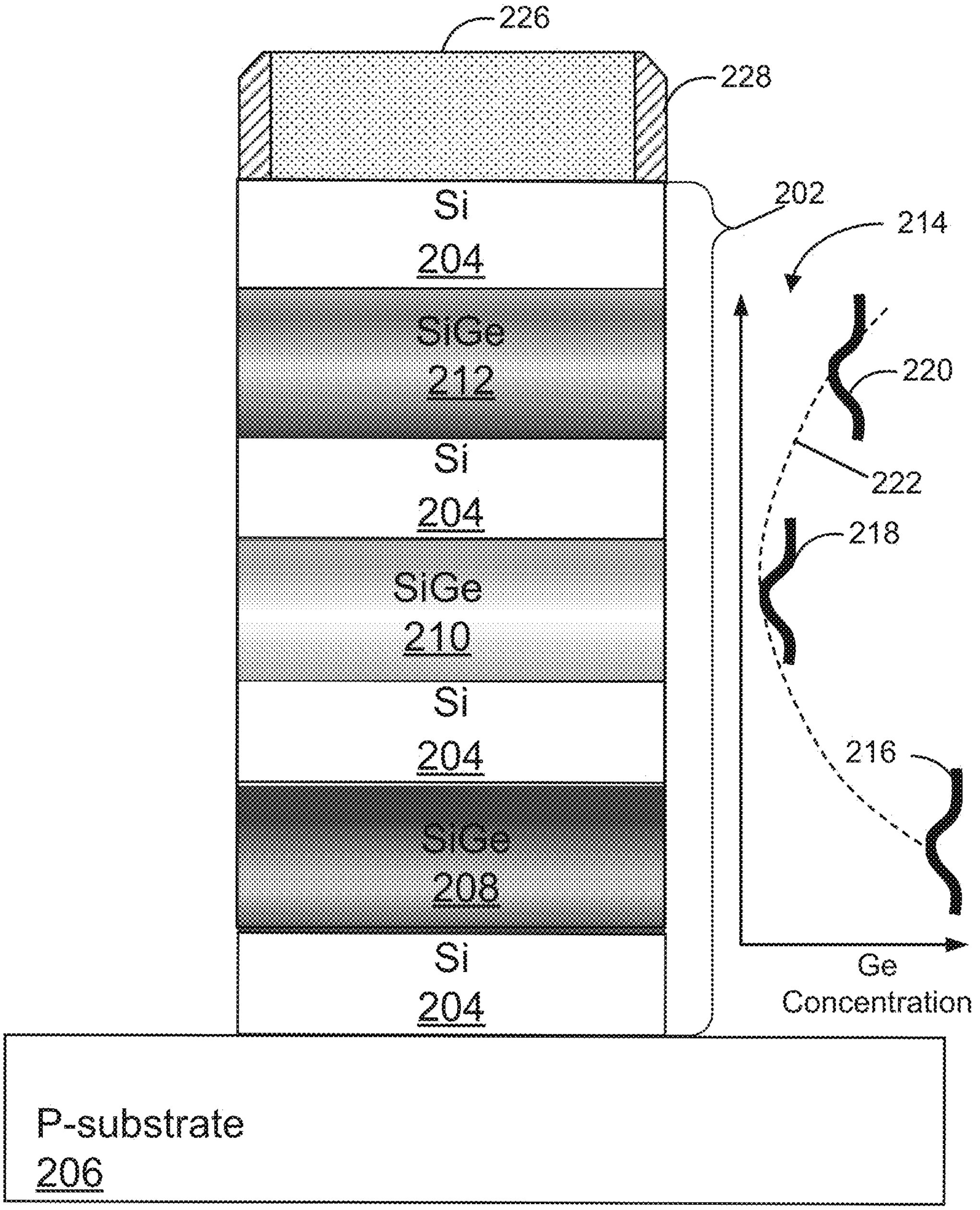

In FIG. 2D, the multi-layer structure 202 is cut to the same width as the width of the outer gate spacer 228 to prepare the layers of the multi-layer structure 102 for etching.

Figure 2E:
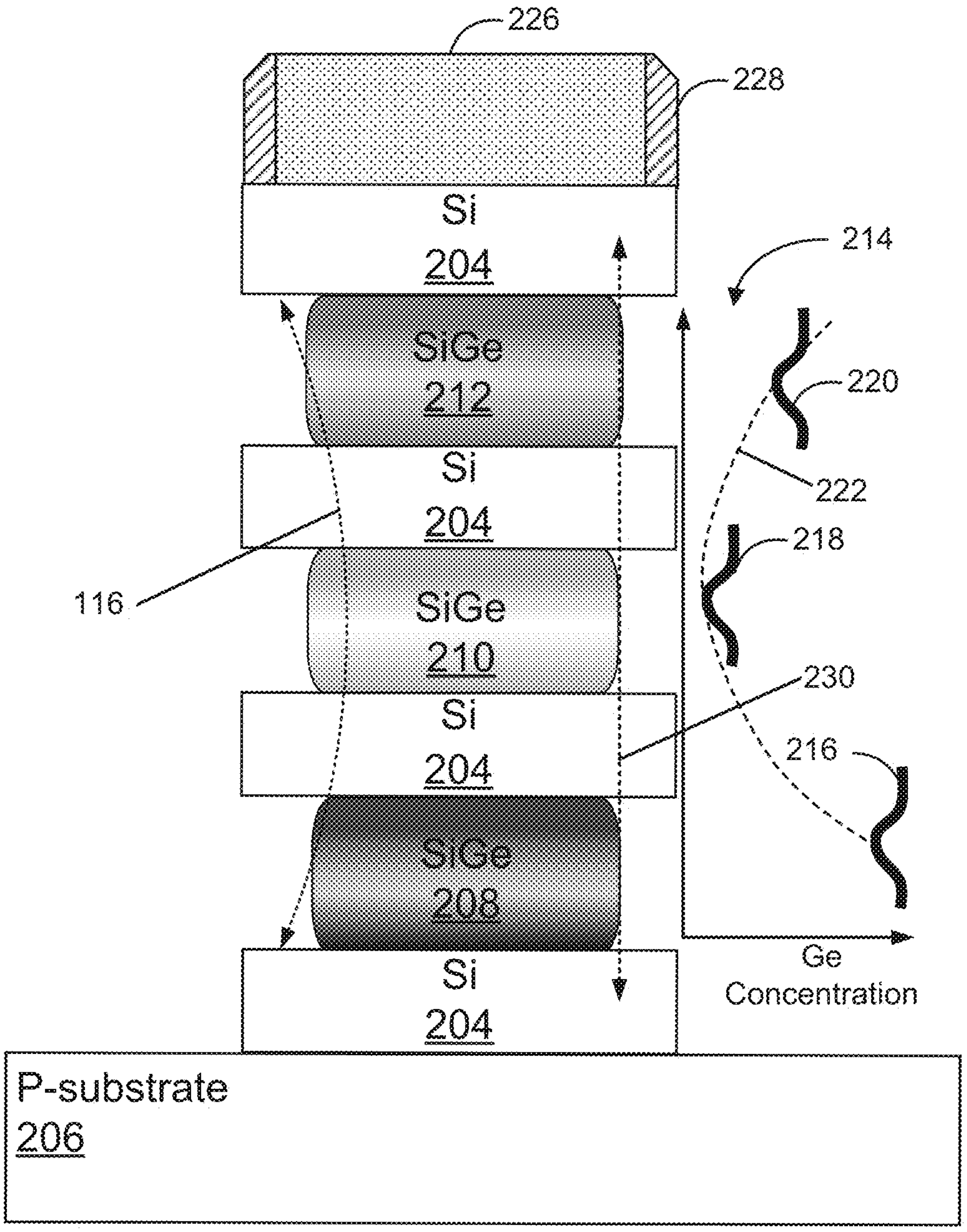

In FIG. 2E the multi-layer sheet 202 has been subject to a selective etching process. During the selective etching, the Si sheets 204 remain generally undisturbed while the edges of the SiGe sheets 208, 210, and 212 are etched at a rate that corresponds to the concentration of germanium in the respective SiGe sheet. The interlayer germanium concentration differences between the SiGe sheets 208, 210, and 212 results in a generally uniform etching of the SiGe sheets so as to present a generally straight vertical SiGe sheet recess profile 230 in comparison to the curved SiGe sheet recess profile shown at line 116 in FIG. 1D and reproduced here for case of comparison.

Figure 2F:
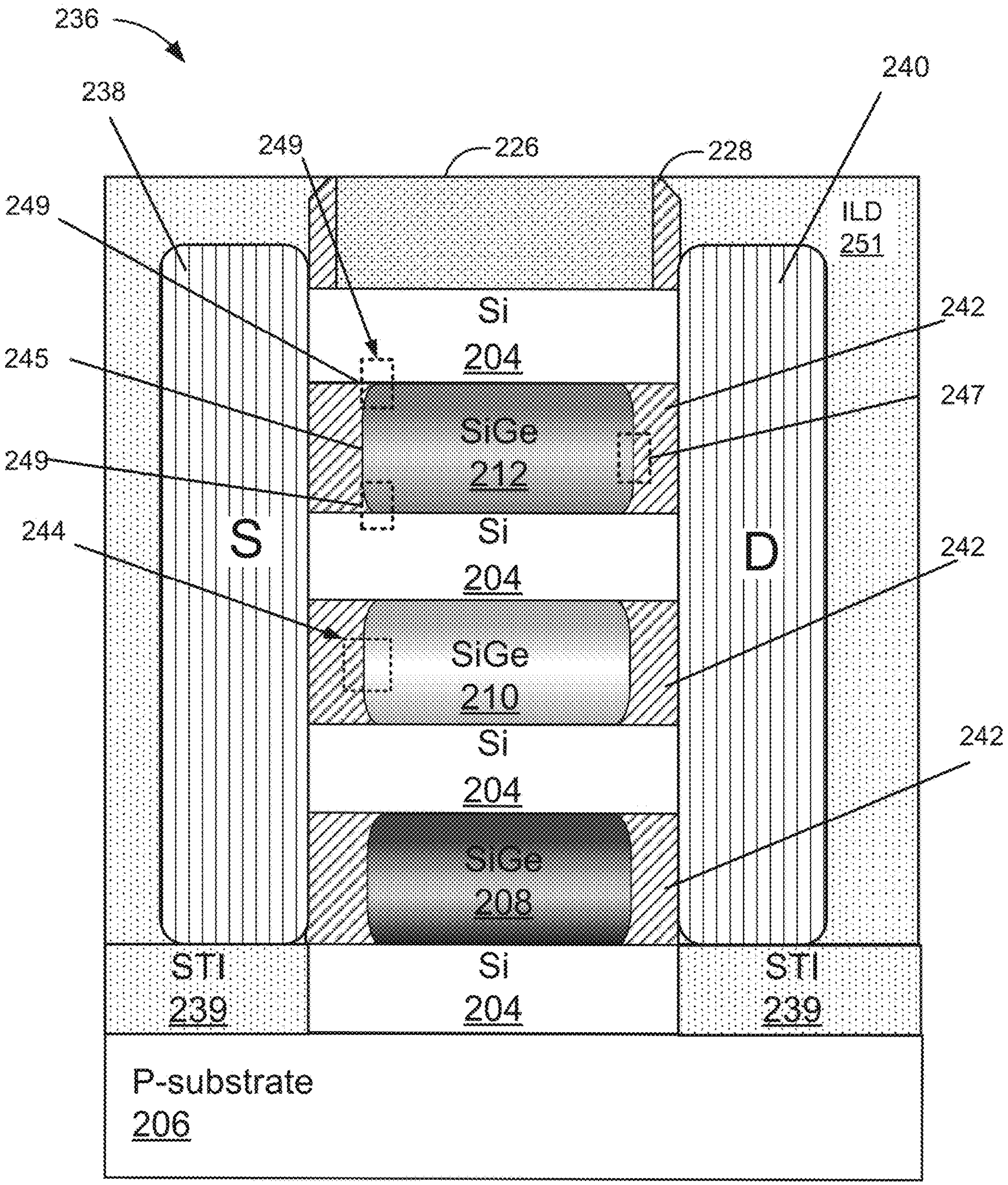

FIG. 2F shows an intermediate structure 236 formed during the GAA transistor fabrication process. Here, epitaxial structures 238 and 240 have been formed on opposite sides of the Si sheets 204. The epitaxial structures 238 and 240 form the source and drain of the GAA transistor and overlie shallow trench isolation structures 239. The Si sheets 204 extending between the epitaxial structures 238 and 240 form the GAA transistor's channels. The etched SiGe sheets 208, 210, and 212 occupy the regions in which the inner gate structures will be formed. The exterior surfaces of the etched SiGe sheets 208, 210, and 212 serve as an underlying frame over which the inner gate spacers 242 have been formed. In an aspect, the inner gate spacers 242 have interior edges 245 that have a generally convex-shaped cross-section. As used herein, the term "generally convex-shaped cross-section section" should be construed as a convex-shaped cross-section having a cross-section with a continuous radius or a radius that varies along its length. In an aspect, the interior edges 245 need not be perfectly convex-shaped but may include generally flat regions 244, 247 that are bounded by upper and lower rounded corners 249 (e.g., each having a corner rounding of approximately 1~2 nm). As used herein, the term "generally flat region" should be construed as a planar surface or a generally convex-shaped curved region that does not have the same contour (e.g., radius) as the upper and lower rounded corners 249. In an example, the term "generally convex-shaped curved region" should be construed to include a convex-shaped curved region that itself has a convex radius that is not continuous but varies along its cross-section. In this example, an interlayer dielectric 251 is disposed about the outer peripheries of the GAA transistor frame.

Figure 2G:
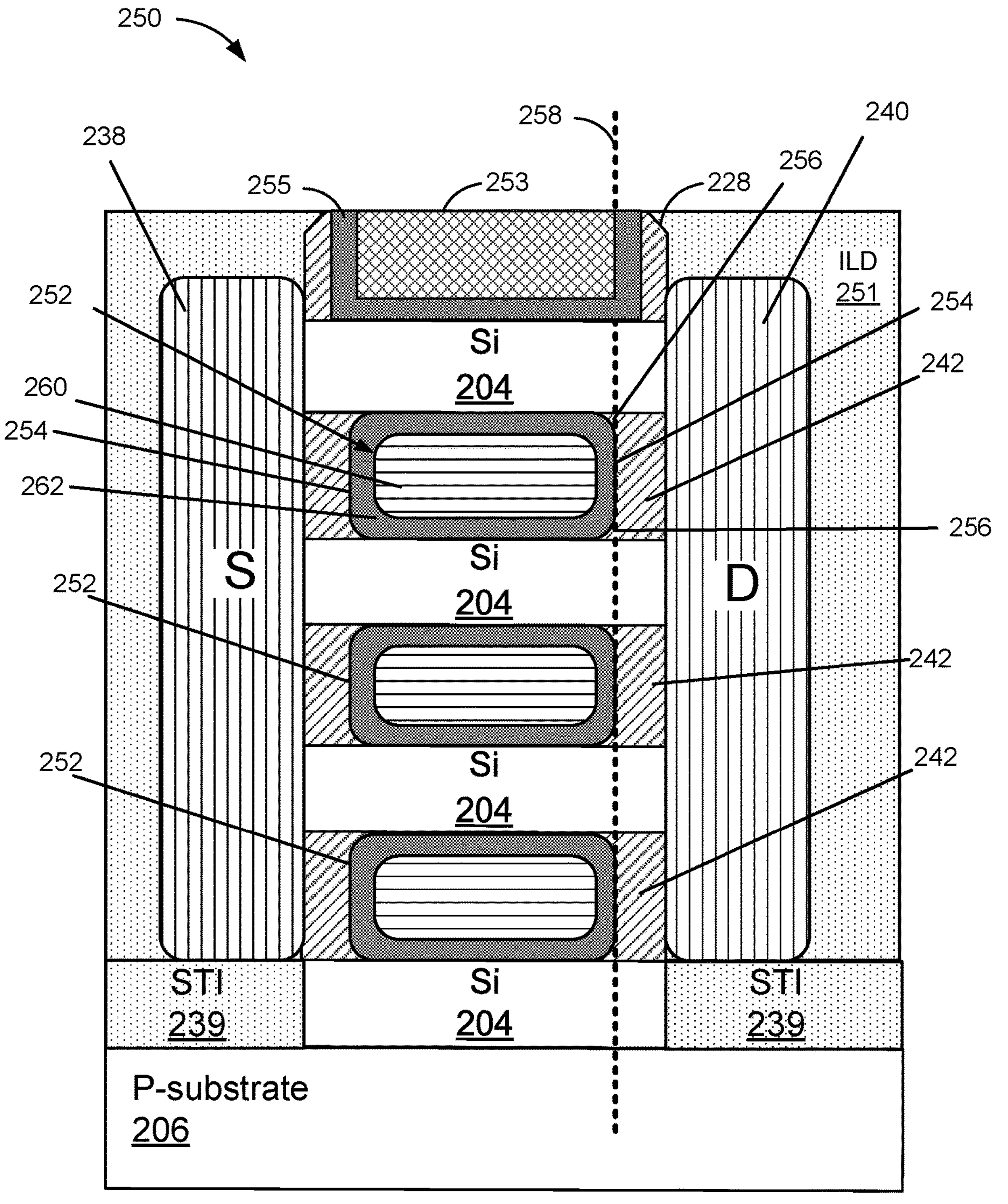

FIG. 2G shows a substantially completed GAA transistor 250. Here, the sacrificial polysilicon 226 has been replaced by an outer gate dielectric layer 253 and an outer gate contact 255 (e.g., tungsten). Additionally, the sacrificial SiGe sheets 208, 210, and 212 have been removed and replaced with inner gates structures 252. In this example, the outer edges 254 of the inner gate structures 252 have a generally convex outer edge that conforms with the inner concave edges of the associated inner gate spacer 242. The generally convex outer edges of the inner gate structures 252 need not be perfectly convex but, as shown in FIG. 2G, may have generally planar regions that are each bounded by upper and lower rounded corners. In an aspect, the upper and lower rounded corners may have a corner rounding between about ~1 nm and ~2 nm. In an aspect, the stacked inner gate structures 252 have an edge profile 258 with a slope that is substantially vertical (e.g., approximately 90 degrees or at least greater than about 87 degrees).

Each inner gate structure 252 includes a work function metal 260 that is bounded at its exterior by a gate dielectric 262. In an aspect, the gate dielectric has a generally uniform thickness such that the outer edges of the gate dielectric 256 conform to the inner edges of the inner gate spacers 242. In an aspect, the outer edge of the work function metal 260 conforms to the inner edge of the gate dielectric 262. As such, the benefits of the desired shape of the SiGe sheets and the SiGe sheet recess profile have propagated to the inner gate structures 252.

Figure 3:
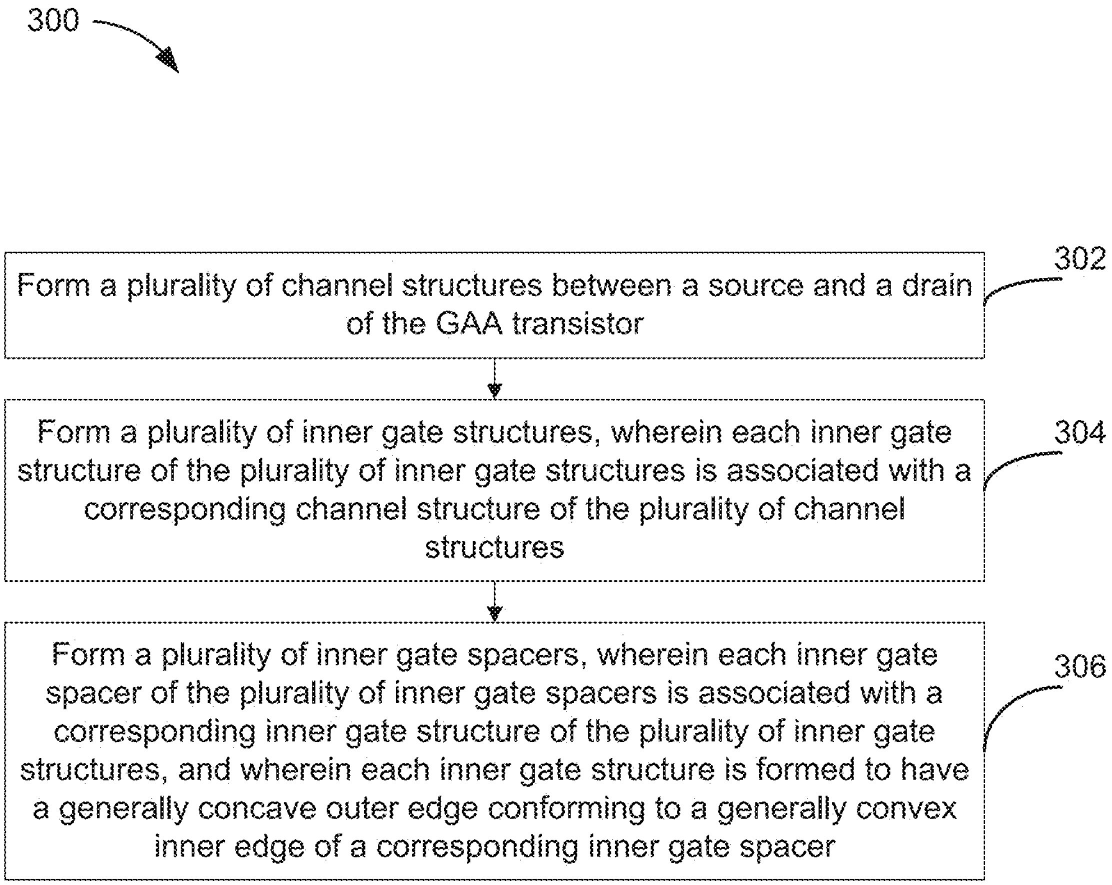
FIG. 3 shows an example method of forming a GAA transistor, according to aspects of the disclosure.

FIG. 3 shows an example method 300 of forming a gate-all-around (GAA) transistor, according to aspects of the disclosure. At operation 302, a plurality of channel structures is formed between a source and a drain of the GAA transistor. At operation 304, a plurality of inner gate structures is formed, wherein each inner gate structure of the plurality of inner gate structures is associated with a corresponding channel structure of the plurality of channel structures. At operation 306, a plurality of inner gate spacers is formed, wherein each inner gate spacer of the plurality of inner gate spacers is associated with a corresponding inner gate structure of the plurality of inner gate structures, and wherein each inner gate structure is formed to have a generally convex outer edge conforming to a generally concave inner edge of a corresponding inner gate spacer. As used herein, the term "generally concave" should be construed as a surface that conforms to the generally convex-shaped cross-section of the outer edges 254 of the inner gate spacers 242.

A technical advantage of the method 300 is that it provides a method of providing inner gate structures and inner gate spacers of a GAA transistor having a reduction in 1) the effective capacitance of the gate structures, 2) the S/D parasitic capacitance, and 3) the risk that a gate structure will short out to the S/D structures when compared to similar GAA transistors that are fabricated using conventional techniques.

Figure 4:
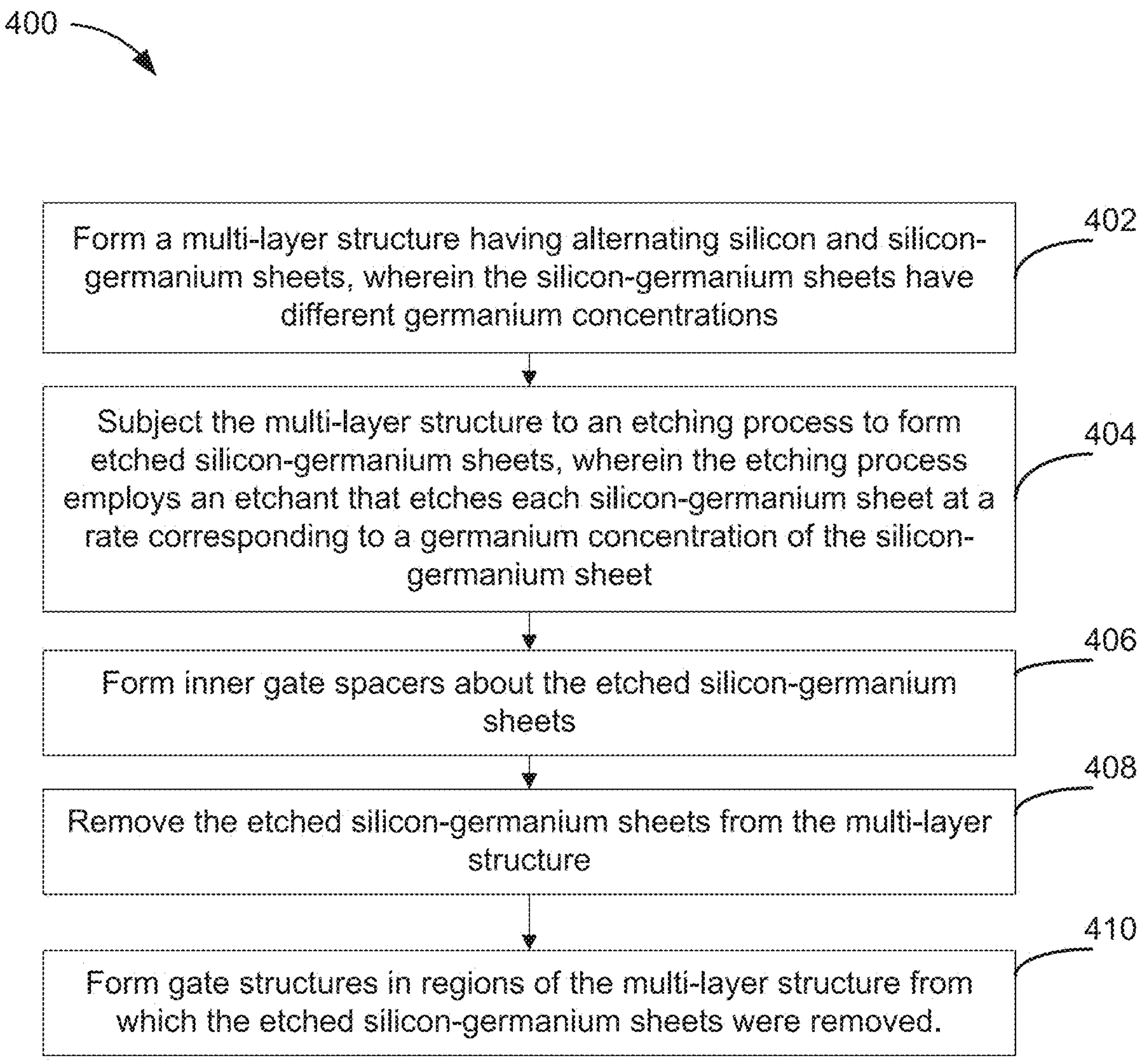
FIG. 4 shows an example method of forming a GAA transistor, according to aspects of the disclosure.

FIG. 4 shows an example method 400 of forming a gate-all-around (GAA) transistor, according to aspects of the disclosure. At operation 402, a multi-layer structure is formed having alternating silicon and silicon-germanium sheets, wherein the silicon-germanium sheets have different germanium concentrations. At operation 404, the multi-layer structure is subjected to an etching process to form etched silicon-germanium sheets, wherein the etching process employs an etchant that etches each silicon-germanium sheet at a rate corresponding to a germanium concentration of the silicon-germanium sheet. At operation 406, inner gate spacers are formed about the etched silicon-germanium sheets. At operation 408, the etched silicon-germanium sheets are removed from the multi-layer structure. At operation 410, gate structures are formed in regions of the multi-layer structure from which the etched silicon-germanium sheets were removed.

A technical advantage of the method 400 is that it provides a method of providing inner gate structures and inner gate spacers of a GAA transistor having a reduction in 1) the effective capacitance of the gate structures, 2) the S/D parasitic capacitance, and 3) the risk that a gate structure will short out to the S/D structures when compared to similar GAA transistors that are fabricated using conventional techniques.

Figure 5:
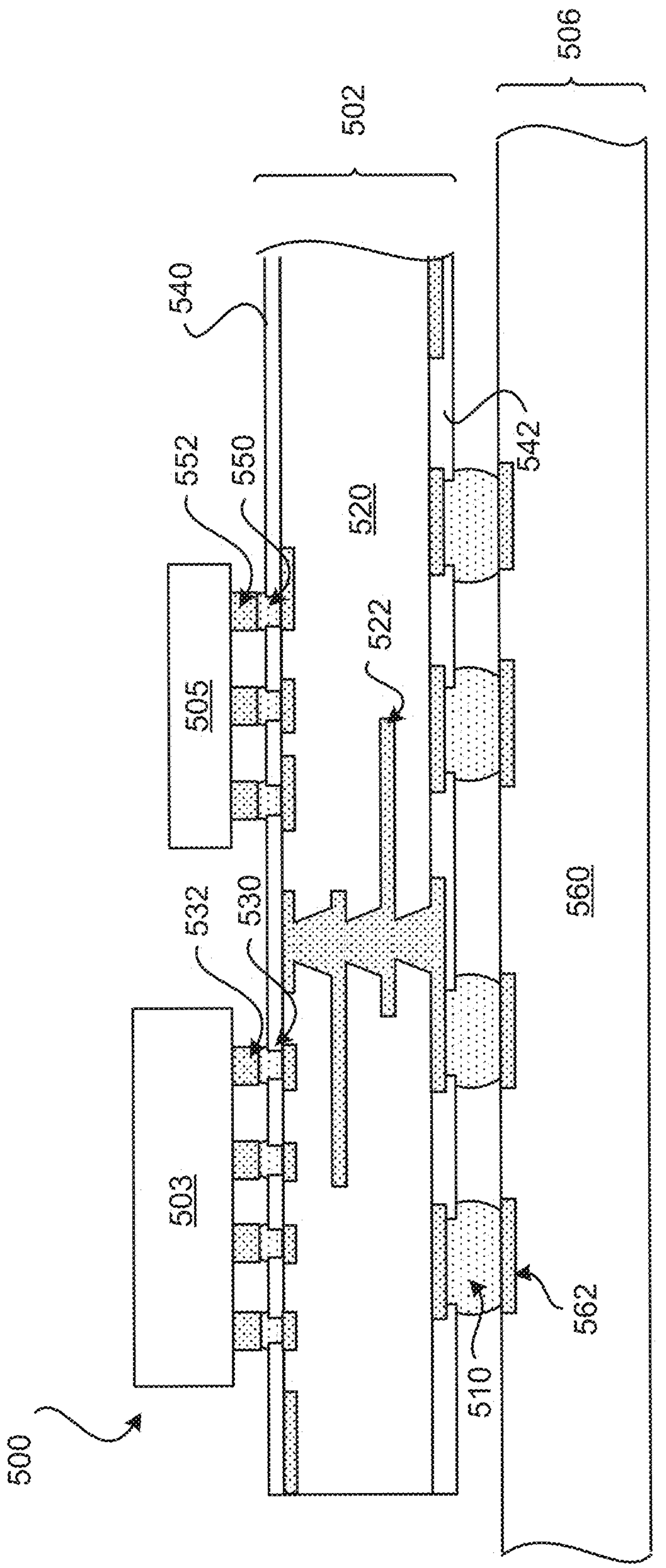
FIG. 5 illustrates a profile view of a package that includes a surface mount substrate, an integrated device, and an integrated passive device, according to aspects of the disclosure.

FIG. 5 illustrates a profile view of a package 500 that includes a surface mount substrate 502, an integrated device 503, and an integrated passive device 505, according to aspects of the disclosure. The package 500 may be coupled to a printed circuit board (PCB) 506 through a plurality of solder interconnects 510. The PCB 506 may include at least one board dielectric layer 560 and a plurality of board interconnects 562.

The surface mount substrate 502 includes at least one dielectric layer 520 (e.g., substrate dielectric layer), a plurality of interconnects 522 (e.g., substrate interconnects), a solder resist layer 540 and a solder resist layer 542. The integrated device 503 may be coupled to the surface mount substrate 502 through a plurality of solder interconnects 530. The integrated device 503 may be coupled to the surface mount substrate 502 through a plurality of pillar interconnects 532 and the plurality of solder interconnects 530. The integrated passive device 505 may be coupled to the surface mount substrate 502 through a plurality of solder interconnects 550. The integrated passive device 505 may be coupled to the surface mount substrate 502 through a plurality of pillar interconnects 552 and the plurality of solder interconnects 550.

The package (e.g., 500) may be implemented in a radio frequency (RF) package. The RF package may be a radio frequency front end (RFFE) package. A package (e.g., 500) may be configured to provide Wireless Fidelity (WiFi) communication and/or cellular communication (e.g., 2G, 3G, 4G, 5G). The package (e.g., 500) may be configured to support Global System for Mobile (GSM) Communications, Universal Mobile Telecommunications System (UMTS), and/or Long-Term Evolution (LTE). The package (e.g., 500) may be configured to transmit and receive signals having different frequencies and/or communication protocols.

Figure 6:
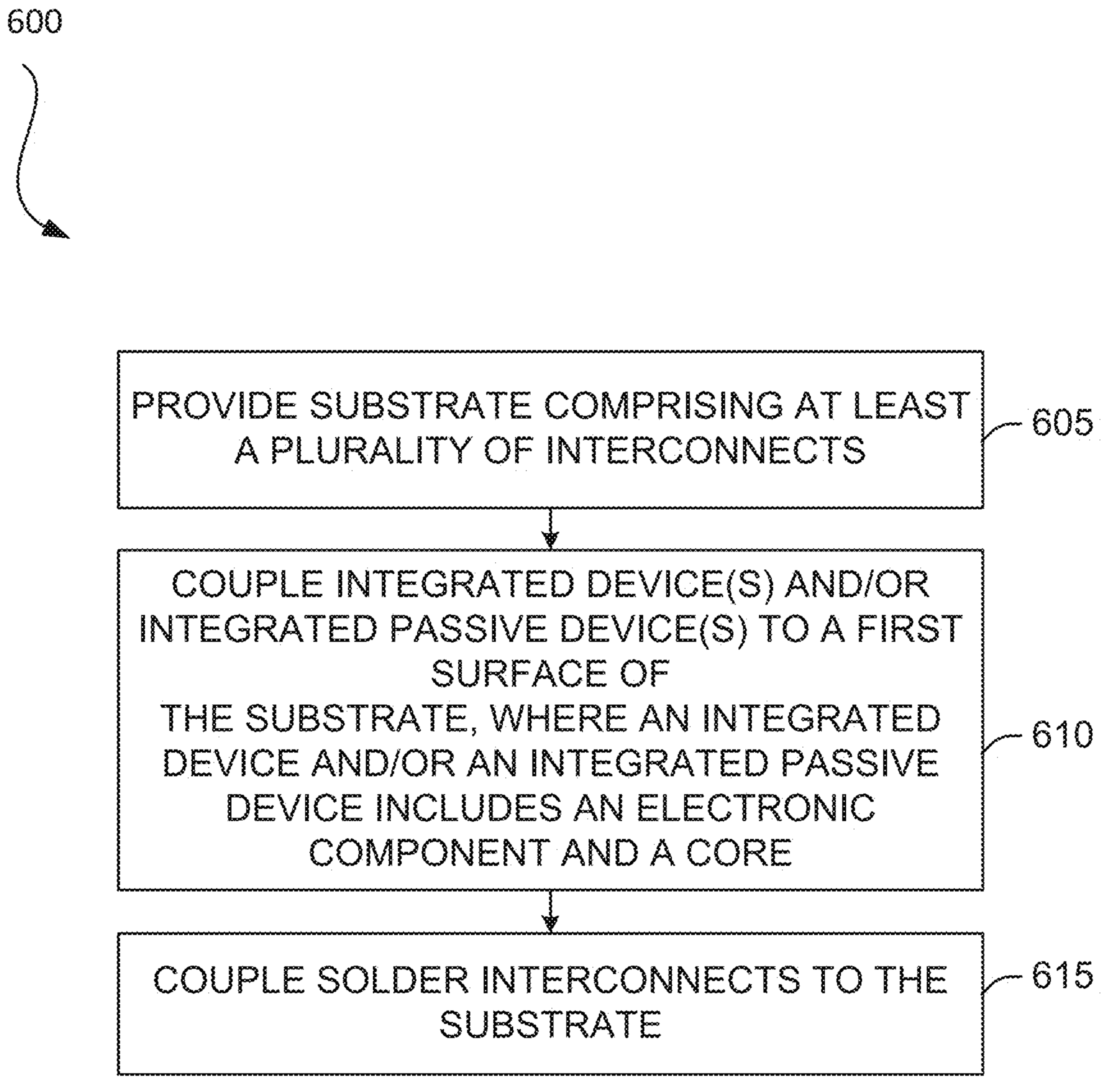
FIG. 6 illustrates an example method for providing or fabricating a package that includes an integrated device comprising an electronic component mounted in a core, according to aspects of the disclosure.

FIG. 6 illustrates an example method 600 for providing or fabricating a package that includes an integrated device comprising an electronic component mounted in a core, according to aspects of the disclosure. In some implementations, the method 600 of FIG. 6 may be used to provide or fabricate the package 500 of FIG. 5 described in the disclosure. However, the method 600 may be used to provide or fabricate any of the packages described in the disclosure.

It should be noted that the method of FIG. 6 may combine one or more processes in order to simplify and/or clarify the method for providing or fabricating a package that includes an integrated device comprising an electronic component mounted in a core, according to aspects of the disclosure. In some implementations, the order of the processes may be changed or modified.

The method provides (at 605) a substrate (e.g., 502). The substrate 502 may be provided by a supplier or fabricated. The substrate 502 includes at least one dielectric layer 520, and a plurality of interconnects 522. The substrate 502 may include an embedded trace substrate (ETS). In some implementations, the at least one dielectric layer 520 may include prepreg layers.

The method couples (at 610) at least one integrated device (e.g., 503) to the first surface of the substrate (e.g., 502). For example, the integrated device 503 may be coupled to the substrate 502 through the plurality of pillar interconnects 532 and the plurality of solder interconnects 530. The plurality of pillar interconnects 532 may be optional. The plurality of solder interconnects 530 are coupled to the plurality of interconnects 522. A solder reflow process may be used to couple the integrated device 503 to the plurality of interconnects through the plurality of solder interconnects 530.

The method also couples (at 610) at least one integrated passive device (e.g., 505) to the first surface of the substrate (e.g., 502). For example, the integrated passive device 505 may be coupled to the substrate 502 through the plurality of pillar interconnects 552 and the plurality of solder interconnects 550. The plurality of pillar interconnects 552 may be optional. The plurality of solder interconnects 550 are coupled to the plurality of interconnects 522. A solder reflow process may be used to couple the integrated passive device 505 to the plurality of interconnects through the plurality of solder interconnects 550.

The method couples (at 615) a plurality of solder interconnects (e.g., 510) to the second surface of the substrate (e.g., 502). A solder reflow process may be used to couple the plurality of solder interconnects 510 to the substrate.

Figure 7:
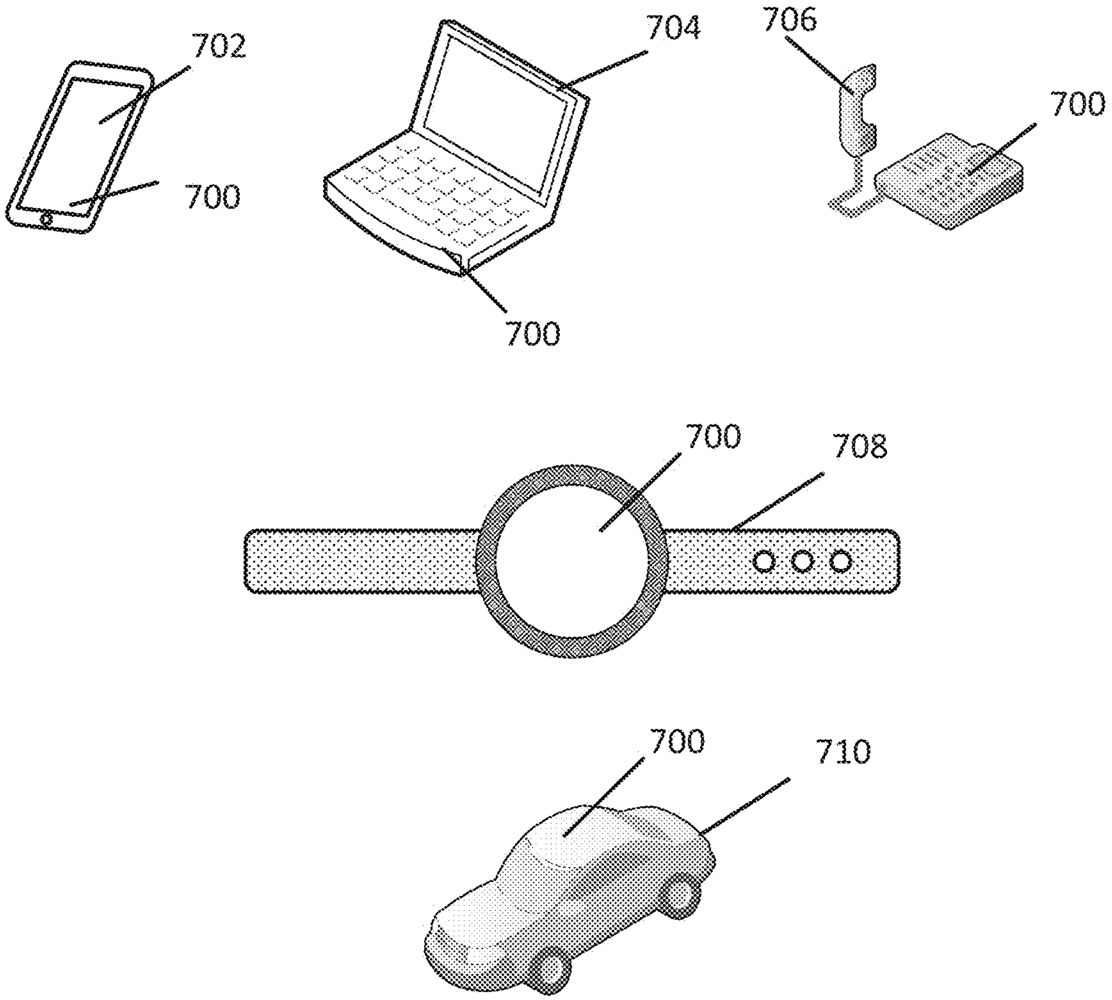
FIG. 7 illustrates various electronic devices that may be integrated with any of the aforementioned devices, integrated devices, integrated circuit (IC) packages, integrated circuit (IC) devices, semiconductor devices, integrated circuits, electronic components, interposer packages, package-on-package (POP), System in Package (SiP), or System on Chip (SoC).

FIG. 7 illustrates various electronic devices that may be integrated with any of the aforementioned devices, integrated devices, integrated circuit (IC) packages, integrated circuit (IC) devices, semiconductor devices, integrated circuits, electronic components, interposer packages, package-on-package (POP), System in Package (SiP), or System on Chip (SoC). For example, a mobile phone device 702, a laptop computer device 704, a fixed location terminal device 706, a wearable device 708, or automotive vehicle 710 may include a device 700 as described herein. The device 700 may be, for example, any of the devices and/or integrated circuit (IC) packages described herein. The devices 702, 704, 706 and 708 and the vehicle 710 illustrated in FIG. 7 are merely exemplary. Other electronic devices may also feature the device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

Implementation examples are described in the following numbered aspects:

Aspect 1. An electronic device having one or more Gate-All-Around (GAA) transistors, at least one of the one or more GAA transistors comprising: one or more inner gate structures having a work function metal bounded by a gate dielectric; and one or more inner gate spacers associated with the one or more inner gate structures, wherein each of the one or more inner gate structures has a generally convex outer edge that conforms to a generally concave inner edge of an associated inner gate spacer of the one or more inner gate spacers.

Aspect 2. The electronic device of aspect 1, wherein: the generally convex outer edge of each of the one or more inner gate structures comprises a generally flat region terminating at upper and lower rounded corners.

Aspect 3. The electronic device of aspect 2, wherein: the upper and lower rounded corners have a corner rounding between about 1 nanometer to 2 nanometers.

Aspect 4. The electronic device of any of aspects 1 to 3, wherein the GAA transistor further comprises: a first stack of channel structures extending between a source structure and a drain structure of the GAA transistor; and wherein the one or more inner gate structures comprise a second stack of inner gate structures associated with the first stack of channel structures, and the one or more inner gate spacers comprise a third stack of inner gate spacers associated with the second stack of inner gate structures.

Aspect 5. The electronic device of aspect 4, wherein: the second stack of inner gate structures has an outer edge profile that is substantially vertical.

Aspect 6. The electronic device of aspect 5, wherein: the outer edge profile has a slope greater than 87 degrees.

Aspect 7. The electronic device of aspect 6, wherein: the outer edge profile has a slope of approximately 90 degrees.

Aspect 8. The electronic device of any of aspects 1 to 7, wherein the electronic device comprises at least one of: a music player; a video player; an entertainment unit; a navigation device; a communications device; a mobile device; a mobile phone; a smartphone; a personal digital assistant; a fixed location terminal; a tablet computer, a computer; a wearable device; a laptop computer; a server; an internet of things (IoT) device; or a device in an automotive vehicle.

Aspect 9. A Gate-All-Around (GAA) transistor, comprising: one or more inner gate structures having a work function metal bounded by a gate dielectric; and one or more inner gate spacers associated with the one or more inner gate structures, wherein each of the one or more inner gate structures has a generally convex outer edge that conforms to a generally concave inner edge of an associated inner gate spacer of the one or more inner gate spacers.

Aspect 10. The GAA transistor of aspect 9, wherein: the generally convex outer edge of each of the one or more inner gate structures comprises a generally flat region terminating at upper and lower rounded corners.

Aspect 11. The GAA transistor of aspect 10, wherein: the upper and lower rounded corners have a corner rounding between about 1 nanometer and 2 nanometers.

Aspect 12. The GAA transistor of any of aspects 9 to 11, wherein the GAA transistor further comprises: a first stack of generally parallel channel structures extending between a source structure and a drain structure of the GAA transistor; and wherein the one or more inner gate structures comprise a second stack of inner gate structures associated with the first stack of channel structures, and the one or more inner gate spacers comprise a third stack of inner gate spacers associated with the second stack of inner gate structures.

Aspect 13. The GAA transistor of aspect 12, wherein: the second stack of inner gate structures has an outer edge profile that is substantially vertical.

Aspect 14. The GAA transistor of aspect 13, wherein: the outer edge profile has a slope greater than 87 degrees.

Aspect 15. The GAA transistor of aspect 14, wherein: the outer edge profile has a slope of approximately 90 degrees.

Aspect 16. A method of forming a gate-all-around (GAA) transistor, comprising: forming a plurality of channel structures between a source and a drain of the GAA transistor; forming a plurality of inner gate structures, wherein each inner gate structure of the plurality of inner gate structures is associated with a corresponding channel structure of the plurality of channel structures; and forming a plurality of inner gate spacers, wherein each inner gate spacer of the plurality of inner gate spacers is associated with a corresponding inner gate structure of the plurality of inner gate structures, and wherein each inner gate structure is formed to have a generally convex outer edge conforming to a generally concave inner edge of a corresponding inner gate spacer.

Aspect 17. The method of aspect 16, wherein: the plurality of channel structures is formed as a first stack of inner channel structures; plurality of inner gate structures is formed as a second stack of inner gate structures; and the plurality of inner gate spacers are formed as a third stack of inner gate structures.

Aspect 18. The method of aspect 17, wherein: the second stack of inner gate structures has an outer edge profile that is substantially vertical.

Aspect 19. The method of aspect 18, wherein: the outer edge profile has a slope greater than 87 degrees.

Aspect 20. The method of any of aspects 18 to 19, wherein: the outer edge profile has a slope of approximately 90 degrees.

Aspect 21. A method of forming a gate-all-around (GAA) transistor, comprising: forming a multi-layer structure having alternating silicon and silicon-germanium sheets, wherein the silicon-germanium sheets have different inter-layer layer germanium concentrations; subjecting the multi-layer structure to an etching process to form etched silicon-germanium sheets, wherein the etching process employs an etchant that etches each silicon-germanium sheet at a rate corresponding to a germanium concentration of the silicon-germanium sheet; forming inner gate spacers about the etched silicon-germanium sheets; removing the etched silicon-germanium sheets from the multi-layer structure; and forming gate structures in regions of the multi-layer structure from which the etched silicon-germanium sheets were removed.

Aspect 22. The method of aspect 21, wherein: at least one silicon-germanium sheet has an intra-layer germanium concentration that varies across a height of the at least one silicon-germanium sheet.

Aspect 23. The method of aspect 22, wherein: the at least one silicon-germanium sheet includes an upper region having a first germanium concentration, a mid-region having a second germanium concentration, and a lower region having a third germanium concentration.

Aspect 24. The method of aspect 23, wherein: the first and third germanium concentrations have a substantially same germanium concentration; and the second germanium concentration is less than both the first and third germanium concentrations.

Aspect 25. The method of any of aspects 23 to 24, wherein: the etched silicon-germanium sheets have a generally vertical recess profile.

Aspect 26. The method of aspect 25, wherein: the generally vertical recess profile has a slope greater than 87 degrees.

Aspect 27. The method of any of aspects 25 to 26, wherein: the generally vertical recess profile has a slope of approximately 90 degrees.

It is noted that the figures in the disclosure may represent actual representations and/or conceptual representations of various parts, components, objects, devices, packages, integrated devices, integrated circuits, and/or transistors. In some instances, the figures may not be to scale. In some instances, for the purpose of clarity, not all components and/or parts may be shown. In some instances, the position, the location, the sizes, and/or the shapes of various parts and/or components in the figures may be exemplary. In some implementations, various components and/or parts in the figures may be optional.

The word “exemplary” is used herein to mean “serving as an example, instance, or illustration.” Any implementation or aspect described herein as “exemplary” is not necessarily to be construed as preferred or advantageous over other aspects of the disclosure. Likewise, the term “aspects” does not require that all aspects of the disclosure include the discussed feature, advantage or mode of operation. The term “coupled” is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term “electrically coupled” may mean that two objects are directly or indirectly coupled together such that an electrical current (e.g., signal, power, ground) may travel between the two objects. Two objects that are electrically coupled may or may not have an electrical current traveling between the two objects. The use of the terms “first”, “second”, “third” and “fourth” (and/or anything above fourth) is arbitrary. Any of the components described may be the first component, the second component, the third component or the fourth component. For example, a component that is referred to a second component, may be the first component, the second component, the third component or the fourth component. The term “encapsulating” means that the object may partially encapsulate or completely encapsulate another object. The terms “top” and “bottom” are arbitrary. A component that is located on top may be located over a component that is located on the bottom. A top component may be considered a bottom component, and vice versa. As described in the disclosure, a first component that is located “over” a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metallization layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the detailed description above, it can be seen that different features are grouped together in examples. This manner of disclosure should not be understood as an intention that the example aspects have more features than are explicitly mentioned in each aspect. Rather, the various aspects of the disclosure may include fewer than all features of an individual example aspect disclosed. Therefore, the following aspects should hereby be deemed to be incorporated in the description, wherein each aspect by itself can stand as a separate example. Although each dependent aspect can refer in the aspects to a specific combination with one of the other aspects, the aspect(s) of that dependent aspect are not limited to the specific combination. It will be appreciated that other example aspects can also include a combination of the dependent aspect(s) with the subject matter of any other dependent aspect or independent aspect or a combination of any feature with other dependent and independent aspects. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of an aspect can be included in any other independent aspect, even if the aspect is not directly dependent on the independent aspect.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An electronic device having one or more Gate-All-Around (GAA) transistors, at least one of the one or more GAA transistors comprising:

one or more inner gate structures having a work function metal bounded by a gate dielectric; and one or more inner gate spacers associated with the one or more inner gate structures, wherein each of the one or more inner gate structures has generally convex outer edges that conform to generally concave inner edges of an associated inner gate spacer of the one or more inner gate spacers, wherein each of the generally convex outer edges comprise a generally flat region terminating at upper and lower rounded corners, wherein a ratio of a corner rounding of the upper and lower rounded corners to a length of the generally flat region is between 1:4 and 1:2, and wherein each of the one or more inner gate structures and associated one or more inner gate spacers have a same height.

2. The electronic device of claim 1, wherein:

the generally convex outer edges of each of the one or more inner gate structures comprises a generally flat region terminating at upper and lower rounded corners.

3. The electronic device of claim 2, wherein:

the upper and lower rounded corners have a corner rounding between about 1 nanometer to 2 nanometers.

4. The electronic device of claim 1, wherein the GAA transistor further comprises:

a first stack of channel structures extending between a source structure and a drain structure of the GAA transistor; and wherein the one or more inner gate structures comprise a second stack of inner gate structures associated with the first stack of channel structures, and the one or more inner gate spacers comprise a third stack of inner gate spacers associated with the second stack of inner gate structures.

5. The electronic device of claim 4, wherein:

the second stack of inner gate structures has an outer edge profile that is substantially vertical.

6. The electronic device of claim 5, wherein:

the outer edge profile has a slope greater than 87 degrees.

7. The electronic device of claim 6, wherein:

the outer edge profile has a slope of approximately 90 degrees.

8. The electronic device of claim 1, wherein the electronic device comprises at least one of:

a music player;

a video player;

an entertainment unit;

a navigation device;

a communications device;

a mobile device;

a mobile phone;

a smartphone;

a personal digital assistant;

a fixed location terminal;

a tablet computer, a computer;

a wearable device;

a laptop computer;

a server;

an internet of things (IoT) device; or a device in an automotive vehicle.

9. A Gate-All-Around (GAA) transistor, comprising:

one or more inner gate structures having a work function metal bounded by a gate dielectric; and one or more inner gate spacers associated with the one or more inner gate structures, wherein each of the one or more inner gate structures has a generally convex outer edge that conforms to a generally concave inner edge of an associated inner gate spacer of the one or more inner gate spacers, wherein the generally convex outer edge of the one or more inner gate structures comprises a generally flat region terminating at upper and lower rounded corners, wherein a ratio of a corner rounding of the upper and lower rounded corners to a length of the generally flat region is between 1:4 and 1:2, and wherein each of the one or more inner gate structures and associated one or more one or more inner gate spacers have a same height.

10. The GAA transistor of claim 9, wherein:

the generally convex outer edge of each of the one or more inner gate structures comprises a generally flat region terminating at upper and lower rounded corners.

11. The GAA transistor of claim 10, wherein:

the upper and lower rounded corners have a corner rounding between about 1 nanometer and 2 nanometers.

12. The GAA transistor of claim 9, wherein the GAA transistor further comprises:

a first stack of channel structures extending between a source structure and a drain structure of the GAA transistor; and wherein the one or more inner gate structures comprise a second stack of inner gate structures associated with the first stack of channel structures, and the one or more inner gate spacers comprise a third stack of inner gate spacers associated with the second stack of inner gate structures.

13. The GAA transistor of claim 12, wherein:

the second stack of inner gate structures has an outer edge profile that is substantially vertical.

14. The GAA transistor of claim 13, wherein:

the outer edge profile has a slope greater than 87 degrees.

15. The GAA transistor of claim 14, wherein:

the outer edge profile has a slope of approximately 90 degrees.

16. A method of forming a gate-all-around (GAA) transistor, comprising:

forming a plurality of channel structures between a source and a drain of the GAA transistor;

forming a plurality of inner gate structures, wherein each inner gate structure of the plurality of inner gate structures is associated with a corresponding channel structure of the plurality of channel structures; and forming a plurality of inner gate spacers, wherein each inner gate spacer of the plurality of inner gate spacers is associated with a corresponding inner gate structure of the plurality of inner gate structures, and wherein each inner gate structure is formed to have generally convex outer edges conforming to generally concave inner edges of corresponding inner gate spacers, wherein each of the generally convex outer edges comprise a generally flat region terminating at upper and lower rounded corners, wherein a ratio of a corner rounding of the upper and lower rounded corners to a length of the generally flat region is between 1:4 and 1:2, and wherein each of inner gate structure and associated inner gate spacer has a same height.

17. The method of claim 16, wherein:

the plurality of channel structures is formed as a first stack of inner channel structures;

plurality of inner gate structures is formed as a second stack of inner gate structures; and the plurality of inner gate spacers are formed as a third stack of inner gate structures.

18. The method of claim 17, wherein:

the second stack of inner gate structures has an outer edge profile that is substantially vertical.

19. The method of claim 18, wherein:

the outer edge profile has a slope greater than 87 degrees.

20. The method of claim 18, wherein:

the outer edge profile has a slope of approximately 90 degrees.

21. A method of forming a gate-all-around (GAA) transistor, comprising:

forming a multi-layer structure having alternating silicon and silicon-germanium sheets, wherein the silicon-germanium sheets have different interlayer layer germanium concentrations;

subjecting the multi-layer structure to an etching process to form etched silicon-germanium sheets, wherein the etching process employs an etchant that etches each silicon-germanium sheet at a rate corresponding to a germanium concentration of the silicon-germanium sheet;

forming inner gate spacers about the etched silicon-germanium sheets;

removing the etched silicon-germanium sheets from the multi-layer structure;

forming gate structures in regions of the multi-layer structure from which the etched silicon-germanium sheets were removed; and wherein each of the gate structures has a generally convex outer edge that conforms to a generally concave inner edge of an associated inner gate spacer, wherein the generally convex outer edge of each gate structures comprises a generally flat region terminating at upper and lower rounded corners, wherein a ratio of a corner rounding of the upper and lower rounded corners to a length of the generally flat region is between 1:4 and 1:2, and wherein each gate structure and associated inner gate spacers have a same height.

22. The method of claim 21, wherein:

at least one silicon-germanium sheet has an intra-layer germanium concentration that varies across a height of the at least one silicon-germanium sheet.

23. The method of claim 22, wherein:

the at least one silicon-germanium sheet includes:

an upper region having a first germanium concentration, a mid-region having a second germanium concentration, and a lower region having a third germanium concentration.

24. The method of claim 23, wherein:

the first and third germanium concentrations have a substantially same germanium concentration; and the second germanium concentration is less than both the first and third germanium concentrations.

25. The method of claim 23, wherein:

the etched silicon-germanium sheets have a generally vertical recess profile.

26. The method of claim 25, wherein:

the generally vertical recess profile has a slope greater than 87 degrees.

27. The method of claim 25, wherein:

the generally vertical recess profile has a slope of approximately 90 degrees.

* * * * *